United States Patent [19]
Wiggers

[11] Patent Number: 6,011,710
[45] Date of Patent: Jan. 4, 2000

[54] CAPACITANCE REDUCING MEMORY SYSTEM, DEVICE AND METHOD

[75] Inventor: Hans A. Wiggers, Saratoga, Calif.

[73] Assignee: Hewlett-Packard Company, Palo Alto, Calif.

[21] Appl. No.: 08/960,940

[22] Filed: Oct. 30, 1997

[51] Int. Cl.[7] ..................................................... G11C 5/06
[52] U.S. Cl. ...................................... 365/63; 365/230.03
[58] Field of Search ................................. 365/230.03, 63, 365/72, 189.02; 395/287, 288

[56] References Cited

U.S. PATENT DOCUMENTS

| | | | |
|---|---|---|---|
| 5,719,817 | 2/1998 | Schaefer | 365/63 |
| 5,781,495 | 7/1998 | Arimoto | 365/63 |
| 5,802,395 | 9/1998 | Connolly et al. | 395/834 |
| 5,862,076 | 1/1999 | Eitan | 365/63 |

*Primary Examiner*—Tan T. Nguyen

[57] ABSTRACT

A memory system for minimizing the capacitive load of the memory data bus. The invention provides a digital memory system including a controller, a data bus in electrical communication with the controller, and memory devices. The controller operates to selectively couple one of the memory devices to the data bus when accessing a memory location in that memory device and to decouple that memory device from the data bus at other times. This selective coupling of the memory devices minimizes capacitive loading of the data bus. A method according to the includes establishing an electrical connection between one of the memory devices and the external circuit in response to a request from the external circuit to access a memory location in the memory device. Next, the requested access to the memory location is provided. Then the electrical connection between the memory device and the external circuit is broken after the access has been completed, thereby reducing capacitive loading of the external circuit.

15 Claims, 6 Drawing Sheets

CAPACITANCE REDUCING MEMORY SYSTEM, DEVICE AND METHOD

BACKGROUND OF THE INVENTION

1. Field of the Invention

This disclosure relates to digital memory. More particularly, this disclosure provides a reduced capacitance memory system and device, and further provides a method for operating a memory system to reduce capacitance and transmission line stub length within the system.

2. Description of the Related Art

As computers and their central processing units ("CPUs") become capable of executing instructions more rapidly, this ability carries with it a need for increased memory size and speed, and also bus size. The need has given rise to much design effort directed toward optimizing current and future memory device designs to provide quick memory response. Commonly-recognized current examples of memory devices include dynamic random access memories ("DRAMs"), read only memories ("ROMs") and static random access memories ("SRAMs"), as well as mechanical and optical devices, such as CD-ROMs.

In performing a typical data read operation, a memory controller (usually the CPU or, in larger systems, a dedicated memory controller) sends a read command to a particular memory chip. This command is propagated to the chip along one or more lines of a command bus. When received by the particular chip, the command causes the chip to locate and direct an output from its internal memory array onto a data bus, as a return data signal intended for the memory controller. The output then propagates along the data bus, which may or may not travel the same route as the command bus. In the example just given, there are three sources of time delay, including the propagation time of a read command from the controller to the chip, the time required for the chip to power its internal registers and to channel the proper output onto the data bus, and the time required for propagation of the output back to the controller.

Similarly, in performing a typical data write operation, the memory controller sends a write command to a particular memory chip along with the data to be written. This command is propagated to the chip along one or more lines of a command bus, while the data is propagated to the chip along one or more line of a data bus. When received by the particular chip, the command causes the chip to channel the data from the data bus to the specified location of its internal memory array. The data propagating along the data bus may or may not travel the same route as the command propagating along the command bus. In the example just given, there are three sources of time delay, including the propagation time of a write command from the controller to the chip, the time required for propagation of the data from the controller, and the time required for the chip to power its internal registers and to channel the data from the data bus.

Typically, design efforts have focused primarily on improving internal routing and processing of instructions within memory chips. These design efforts, however, while continually providing more responsive memory devices, do not address the primary cause of propagation delay along the data bus, inherent capacitance of the data bus. As a result, many systems are sending data over the data bus at rates far lower than the operating speeds of the CPUs.

The problem of inherent capacitance is further explained with reference to FIGS. 1 and 2. FIG. 1 illustrates a data path within a typical memory system 1. The data path includes a memory controller 2, a motherboard 3, memory chips 4, memory modules 5, and a data bus 6. The data bus 6 includes board trace portions 7, module trace portions 8, connectors 9, and termination 10. The memory controller is affixed to the motherboard and is electrically connected to the memory chips via the data bus. The memory chips are affixed to the memory modules. The board trace portion of the data bus is affixed to the motherboard and the module trace portion of the data bus is affixed to the memory modules. The board trace portion has a termination 10. The connectors 9 electrically connect the board trace portions to the module trace portions and mechanically affix the memory modules to the motherboard.

FIG. 2 depicts the electrical equivalent 11 of the typical data path shown in FIG. 1. For ease of reference, each electrical equivalent in FIG. 2 that represents a component shown in FIG. 1 is labeled with the reference numeral of the represented component with the suffix "A". It should be noted that the board trace portion 7A is made up of inductive and capacitive elements which together behave as a transmission line 12 having a set of impedance and transmission delay characteristics. Similarly, each of the module trace portions 8A are made up of inductive and capacitive elements which together behave as transmission lines 13, each having its own set of impedance and transmission delay characteristics.

When properly terminated with a resistor 10A, the board trace portion 7A acts as a nearly perfect transmission line (not shown) without inherent capacitance and will not in and of itself limit the operating speed of the memory system. When combined with the module trace portions 8A, however, the module trace portions 13 act as transmission line stubs coming off of the board trace portion 7A. These stubs together have a "comb filter" effect that includes significant signal reflections in the memory system that decreases signal integrity. This "comb filter" effect imposes a load on the data bus and effectively breaks the board trace portion 7A into individual board trace portion transmission lines 13.

The load imposed by the "comb filter" effect limits the maximum transmission speed of data propagation in both the board trace portion 7A and the module trace portions 8A. The "comb filter" effect imposed by the stubs generally increases as the length of each the module trace portions 7A increases. Similarly, the "comb filter" effect imposed by the stubs generally decreases as the length of each of the module trace portions decreases. A second cause of the propagation delays for data signals sent from the memory controller 2A to the memory chips 4A are the inductive element 14 and capacitive element 15 associated with each memory chip. Together, the inductive and capacitive elements impose a capacitive load on the data bus including both the module trace portions 8A and the board trace portion 7A. The load imposed by the "comb filter" effect and the capacitive load imposed by the memory chip elements together form the inherent capacitance load on the memory bus.

Current memory systems attempt to solve the problem of inherent capacitance in the memory bus in several ways. One solution is to provide series resistors on the module trace portion of the data bus in order to electrically separate the module trace portion from the board trace portion of the bus. This technique has been successfully used for frequencies of up to 66 MHZ, but has not been very successful at higher frequencies. Another solution is to provide FET switches on the mother board that break the data bus into sections. For example, a switch multiplexor has been used to separate a set of four memory modules into two electrically independent groups of two modules. This approach creates two smaller memory busses, each presenting less inherent capacitance that the original larger bus. Each of these smaller busses however, still have inherent capacitance load on the data bus and thus have limited signal propagation speed.

In order to keep pace with CPU design and the tendency toward increased computer speed and memory capacity there exists a need for faster memory systems. In particular, there exists a need for a memory system that minimizes the inherent capacitance load on the data bus in order to speed data propagation along the data bus.

SUMMARY OF THE INVENTION

The present invention provides a memory system minimizing the inherent capacitance of the data bus in a memory system. It provides increased propagation speed for data traveling both from a memory chip to a memory controller and in the reverse direction. As a result it provides a faster memory system as will be required by computers of the future.

Briefly and in general terms, the invention provides a digital memory system including a controller, a data bus in electrical communication with the controller, and memory devices. The controller operates to selectively couple one of the memory devices to the data bus when accessing a memory location in that memory device and to decouple that memory device from the data bus at other times. This selective coupling of the memory devices minimizes capacitive loading of the data bus.

The invention may also include switches electrically connected to the data bus and controlled by the controller such that the controller uses the switches to selectively couple and decouple the memory devices from the data bus. These switches may include field effect transistors. In addition, the memory devices may include random access memory.

The invention also provides a memory module for reducing the capacitance in a memory system data bus. The memory module includes a substrate. A memory chip and data pins are affixed to the substrate. A memory module according to the invention also includes switches. Data lines electrically connect the data pins, the switches, and the memory chip such that the data lines connecting the data pins and the switch can be decoupled from the data lines connecting the switches and the memory chip. This reduces the capacitive loading on the data lines when measured from the data pins. The switches are preferably proximate to the data pins and include field effect transistors.

The invention also provides a method of minimizing capacitive loading the external circuit in a memory system that includes a plurality of memory devices that communicate with the external circuit. The method according to the invention includes a step of establishing an electrical connection between one of the memory devices and the external circuit in response to a request from the external circuit to access a memory location in the memory device. Next, the requested access to the memory location is provided. The electrical connection between the memory device and the external circuit is broken after the access has been completed, thereby reducing capacitive loading of the external circuit. The method may also include a step of granting access the another memory location in the memory device before breaking the connection when the next request from the external circuit is to access a memory location in the said memory device.

Other aspects and advantages of the present invention will become apparent from the following detailed description, taken in conjunction with the accompanying drawings, illustrating by way of example the principles of the invention.

DESCRIPTION OF THE PREFERRED EMBODIMENT

Figure 1:
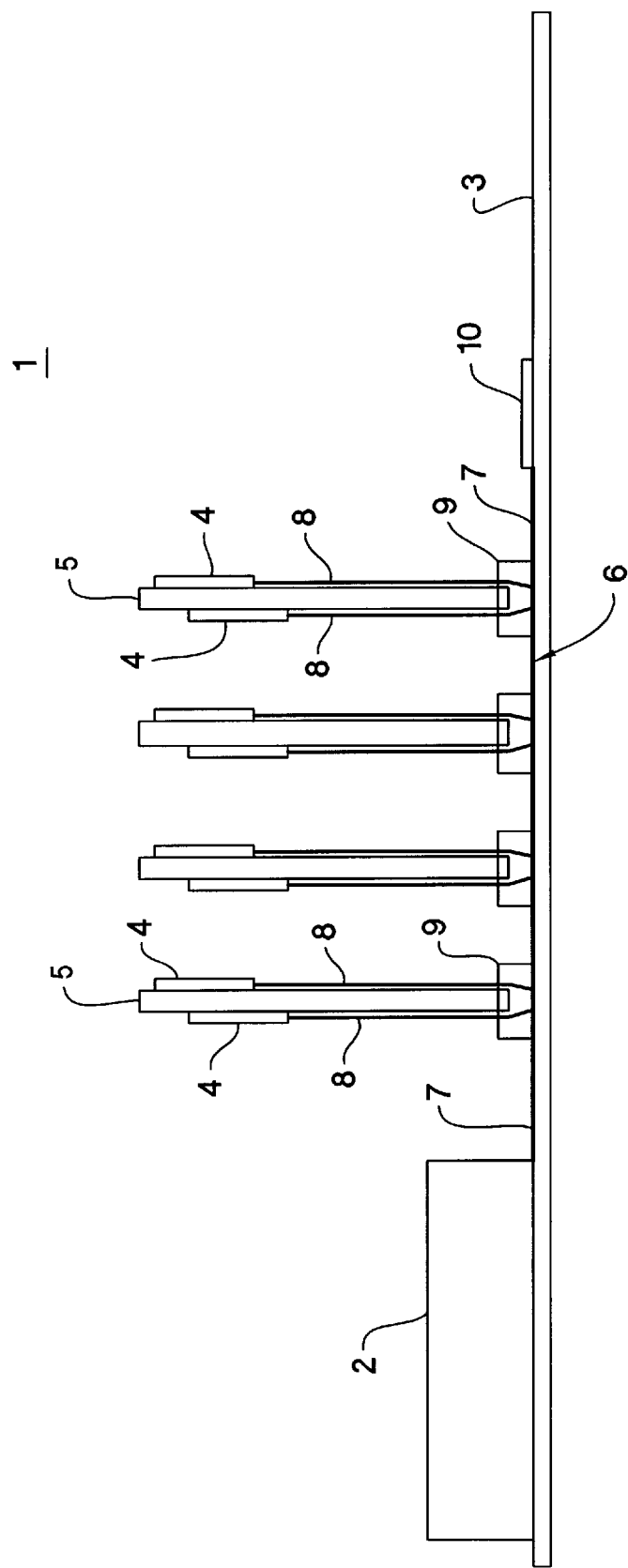
FIG. 1 is a side view of a prior art memory system.
Figure 2:
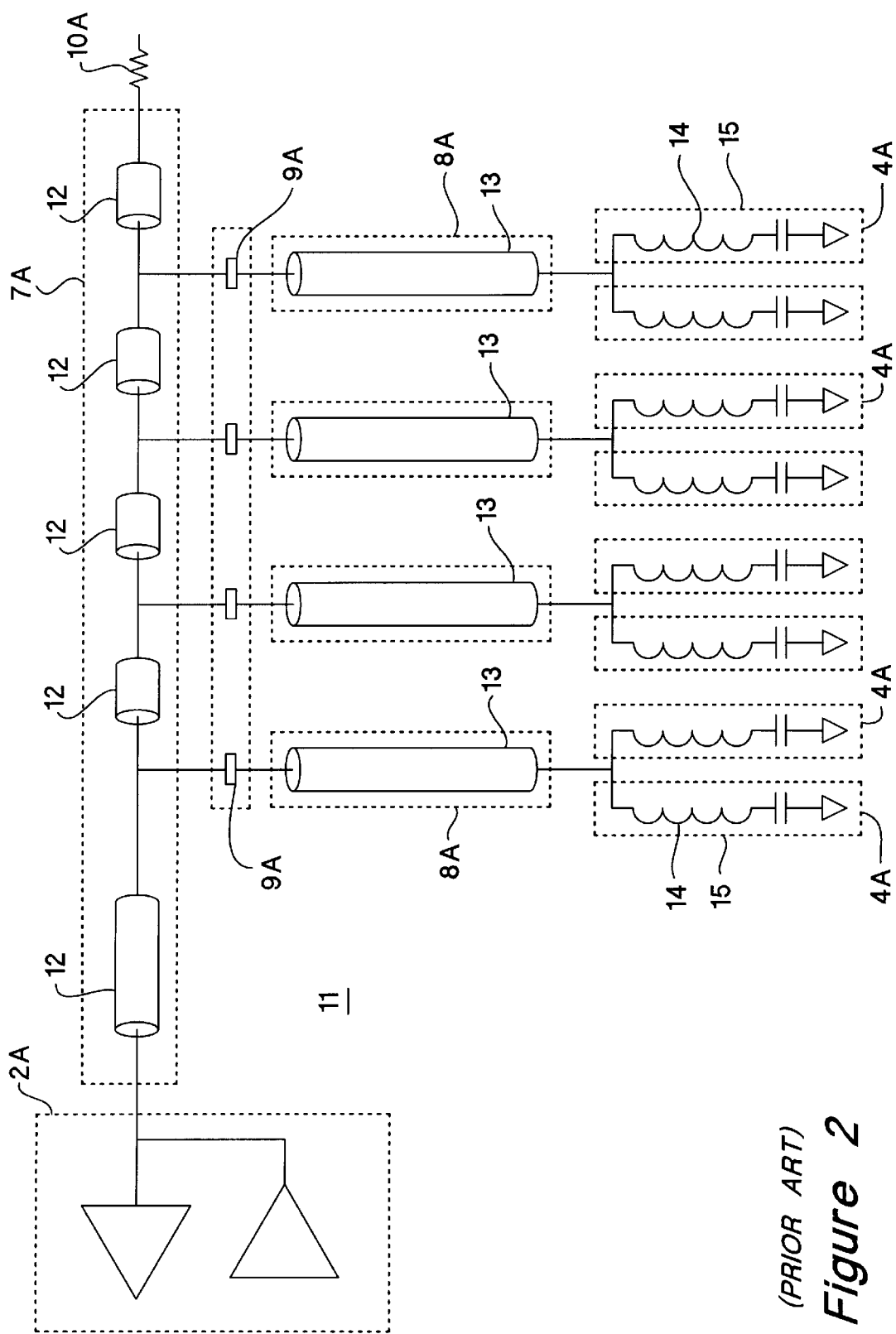
FIG. 2 is a schematic diagram illustrating the electrical equivalent of the hypothetical prior art memory system of FIG. 1.

As shown in the drawings for purposes of illustration, the invention provides a memory system, a memory module and a method for reducing the capacitive load on a data bus. The invention is based upon the concept that reducing the capacitive load of a memory data bus increases the overall speed at which data can propagate from the memory controller to memory devices, such as dynamic random access memory chips, and vice versa. In addition, lower capacitive loading of the data bus allows each of the data lines that make up the data bus to change states, for example from a voltage representing a logical ONE to a voltage representing a logical ZERO, more quickly.

The invention will provide the faster memory operations demanded by the ever increasing speed of central processing units (CPUs) in computers today. By allowing data to be more quickly sent down a data bus, advances in CPU speed and memory chip speed can be taken advantage of more effectively.

Figure 3:
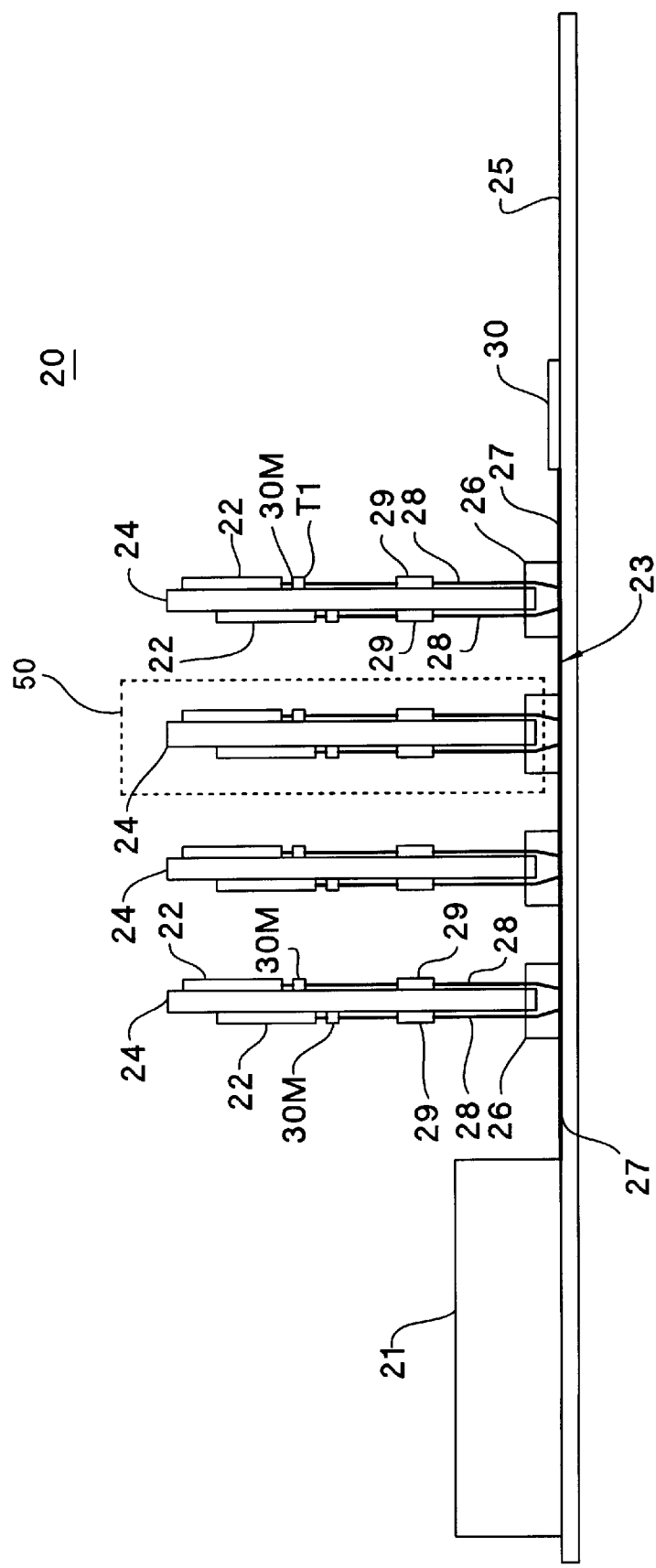
FIG. 3 is a side view of a memory system according to the invention.

A preferred embodiment of the invention provides a memory system 20, indicated in FIG. 3. A memory controller 21, which may be either a CPU or a dedicated memory controller, is electrically connected to a data bus 23. The controller selectively accesses numerous memory devices 22 which are arranged either serially, in parallel, or in some combination of the two along the data bus 23. The memory devices may include read only memory (ROM) or random access memory (RAM), and are preferably dynamic random access memory (DRAM). The memory controller can also selectively electrically couple and decouple each of the memory devices from the data bus, either individually or in small groups using a number of switches 29, preferably including field effect transistor (FET) type switches. In addition to being electrically connected to the data bus, each of these switches is electrically connected to the controller via a control line (not shown in FIG. 3).

The memory devices 22 and switches 29 are preferably affixed to removable memory modules 24 that allow the memory system configuration to be easily changed by simply adding modules or by replacing some or all of the modules. Each of the memory modules 24 are mechanically affixed to a main board 25 by a connector 26. The connector also provides all the electrical connections between the memory controller and the memory devices. The electrical connections include interconnects between the main board portion 27 of the data bus and the module portion 28 on the data bus. The electrical connections also include address bus connections (not shown in FIG. 3) and the switch control line connections (not shown in FIG. 3). The connectors 26 are preferably located along the board portion of the data bus 27 at points between the memory controller 21 and a data bus termination 30. Alternatively, the termination 30 may be replaced by terminations 31.

Figure 4:
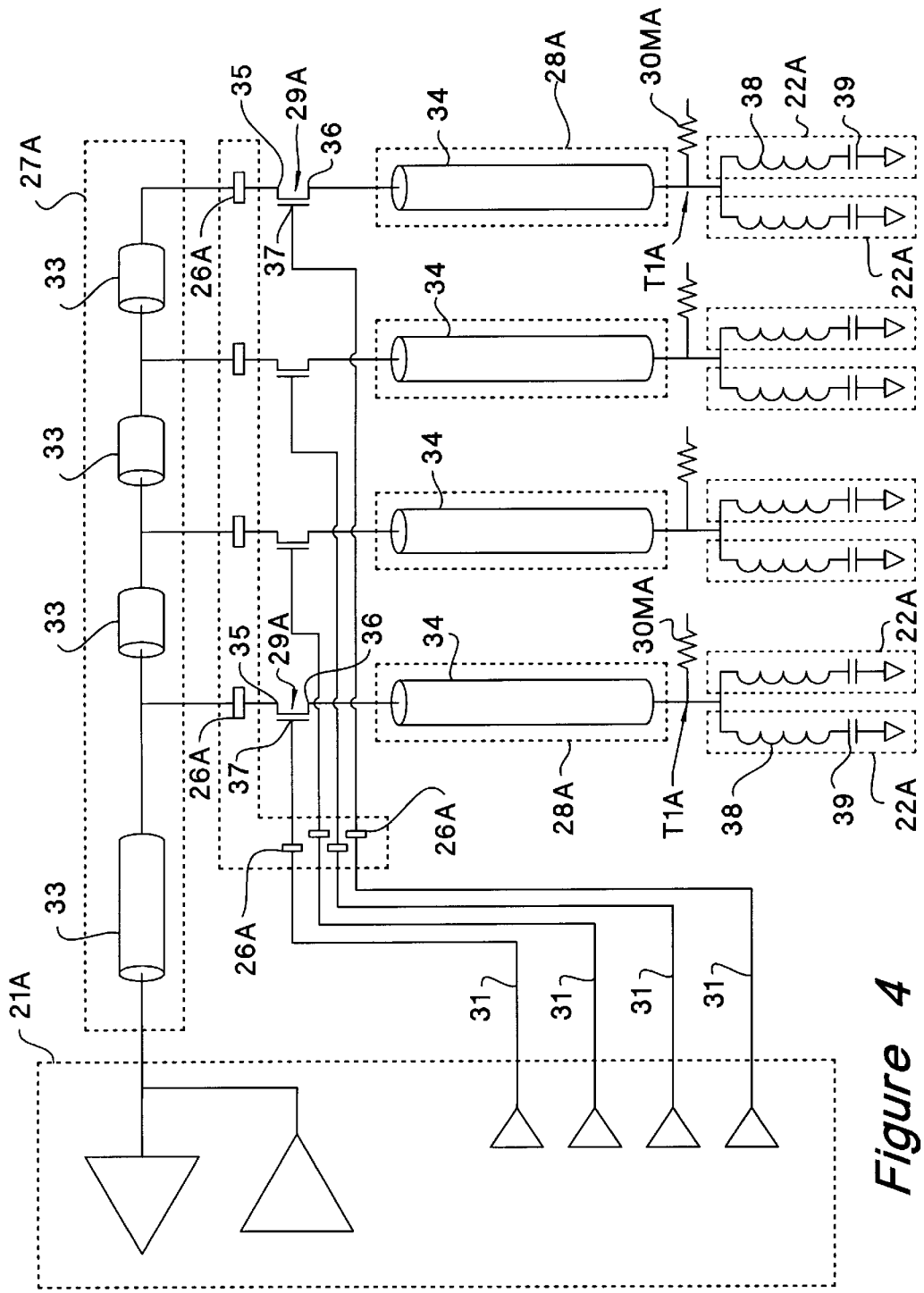
FIG. 4 is a schematic diagram illustrating the electrical equivalent of the memory system of FIG. 3.

FIG. 4 depicts a schematic diagram of the memory system of FIG. 3. For clarity, the electrical equivalents of items shown in FIG. 3 are marked with the same reference numerals as the items with an added "A" suffix. Also for clarity, the data bus is depicted as a single data line. In reality, data busses typically include numerous data lines running in parallel. It is not uncommon to see data busses that include eight, sixteen, thirty-two, sixty-four, seventy two, or more individual parallel data lines. Despite this simplification, FIG. 4 illustrates that the data bus is electrically equivalent to a series of transmission lines. For example, board portion 27A includes a series of transmissions lines 33. Similarly, module portions 28A each include a transmission line 34 that forms a transmission line stub coming off of board portion 27A. Each stub thus formed, creates a "comb filter" effect on the data bus that places a load on the data bus including board portion 27A and module portion 28A. This "comb filter" effect created load is usually proportional both the number of module portions 28A attached to the board portion 27A and to the length of each of the module portions 28A.

In addition each memory device 22A has an associated inductive element 38 and a capacitive element 39. Together these elements create a memory device capacitive load on both the module portion 28A and the board portion 27A of the data bus. The overall capacitive loading of the data bus, including the "comb filter" effect loading and the memory device capacitive loading, must be minimized in order to maximize the speed of the memory system.

Preferably, there is at least one switch 29A for each data line connected to a memory module. The switches each preferably have three terminals: two terminals 35, 36 that can be switched between an electrically coupled state and an electrically decoupled state and one control terminal 37, a signal at which controls the switching of the other two terminals 35, 36. The control signal is sent by the controller 21A to the switches via a control line 31. When multiple data lines are involved, the switches 29A can be grouped together into sets (not shown in FIG. 4) with each switch in the set controlled by a common control signal on a single control line.

When a switch 29A is in an open position (terminals 35 and 36 electrically decoupled) the memory device 22A associated with the open switch is decoupled from the data bus as is the portion of the data bus between the switch and the memory device. This means that no data can be sent or received by the memory device, or memory devices, that have been electrically decoupled from the data bus. It also means that the portion of the data bus between the switch and the memory device is decoupled from the data bus and does not add to the stub length of module portion 28A. Further, the capacitive load of the memory devices 22A which have been decoupled from the data bus as a result of the switch being open will no longer contribute to the overall capacitive load on the data bus (as seen by the memory controller and any coupled memory devices). Data propagation between the memory controller and a coupled memory device will therefore become faster as more of the memory devices and the module portions between the switches and the memory devices are decoupled by the memory controller controlled switches 29A.

Preferably, only those switches 29A which are necessary to couple the memory device with which communication is desired are closed (terminals 35 and 36 electrically coupled) during memory operations with the coupled memory device. This minimized the overall capacitive load on the data bus since all unnecessary capacitive loads are decoupled from the data bus.

It is also desirable that the switches 29A be strategically placed such that they decouple as much of the module portion 28A of the data bus as possible from the board portion 27A. Thus, the data bus remaining electrically coupled to both the memory controller 21A and any selected memory devices will be as short as possible and will create as little "comb filter" effect capacitive load as possible.

For an additional improvement in the performance of the memory system, the bus termination 30 of FIG. 3 can be moved from the end of the board portion 27A to a point T1 located between at the end of each module portion 28A closest to the memory device 22A. The module portion terminations 30M improve performance in conjunction with the switches 29A by allowing each module portion 28A to be electrically connected to the board portion 27A and to form a complete, terminated data bus. Thus, by decoupling all but one of the module portions 28A, the coupled module portion 28A and the board portion 27A will form a nearly ideal transmission line with little or no "comb filter" effect loading and only the memory device capacitive load of the coupled memory device 22A.

Figure 5:
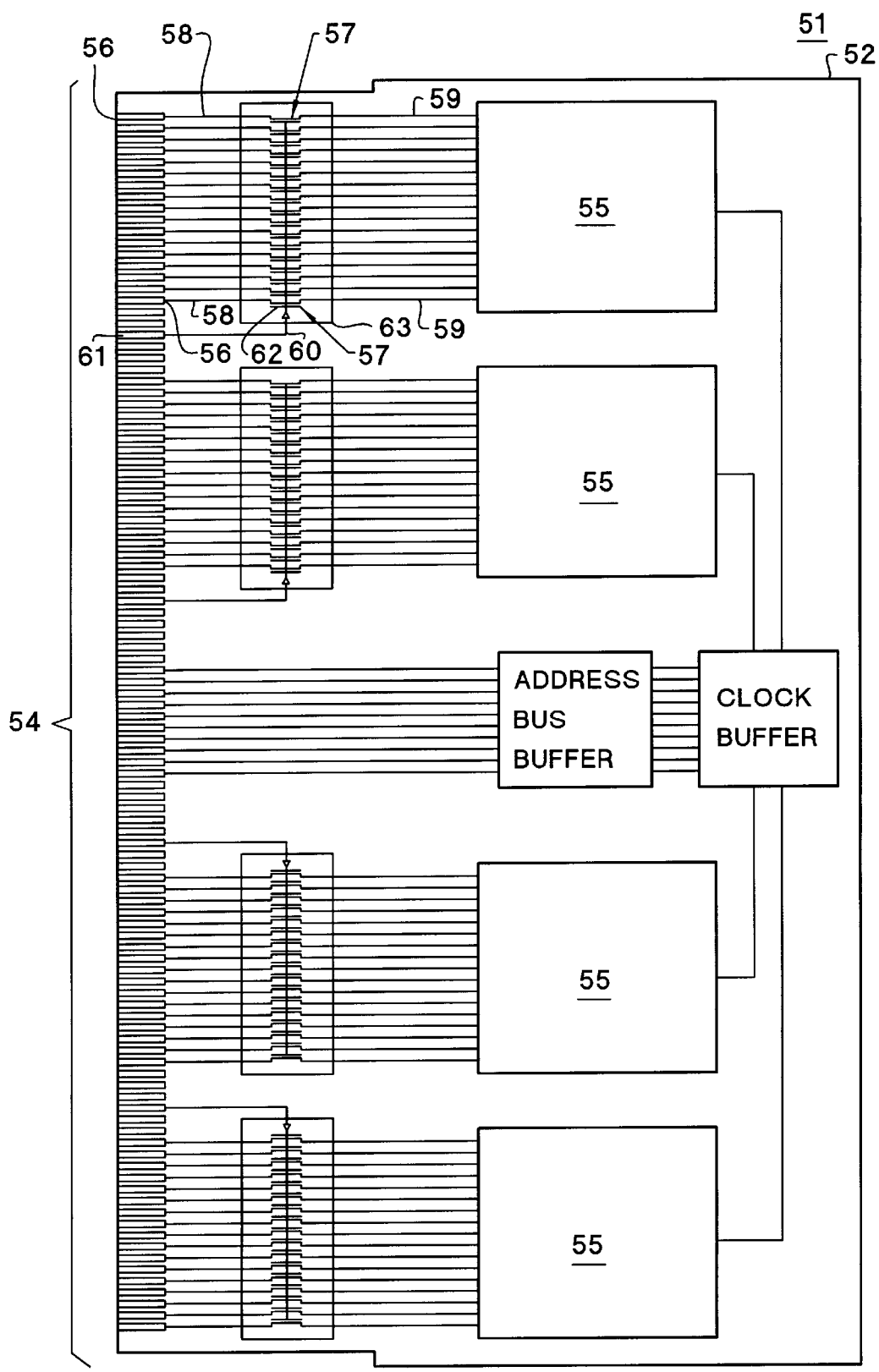
FIG. 5 is a plan view of a memory module according to the invention and shown in a dashed box in FIG. 3.

FIG. 5 is a detailed plan view of a memory module for reducing the capacitive load in the data bus of a memory system according to the invention and of a type shown in box 50 of FIG. 3. The memory module 51 includes a substrate 52. At least one memory chip 55 is affixed the substrate. Data pins 56 are also affixed to the substrate, typically near an edge 54 of the substrate.

Switches 57 are also affixed to the substrate, preferably proximate to the data pins 56. Primary data lines 58 connect each of the data pins to an associated switch. Secondary data lines 59 connect each switch to a memory device. The switches include position controllers 62 for switching the switches between an open position and a closed position. The position controllers are electrically connected to a control line 60 that also electrically connects to a control pin 61 that is preferably affixed to the substrate proximate to the connection edge.

The switches are grouped into sets 63. Each switch in a set is electrically connected to the same control line such that all the switches in a set are either in the open position or the closed position. The switches in the set function to couple and decouple the memory devices from the data pins.

Figure 6:
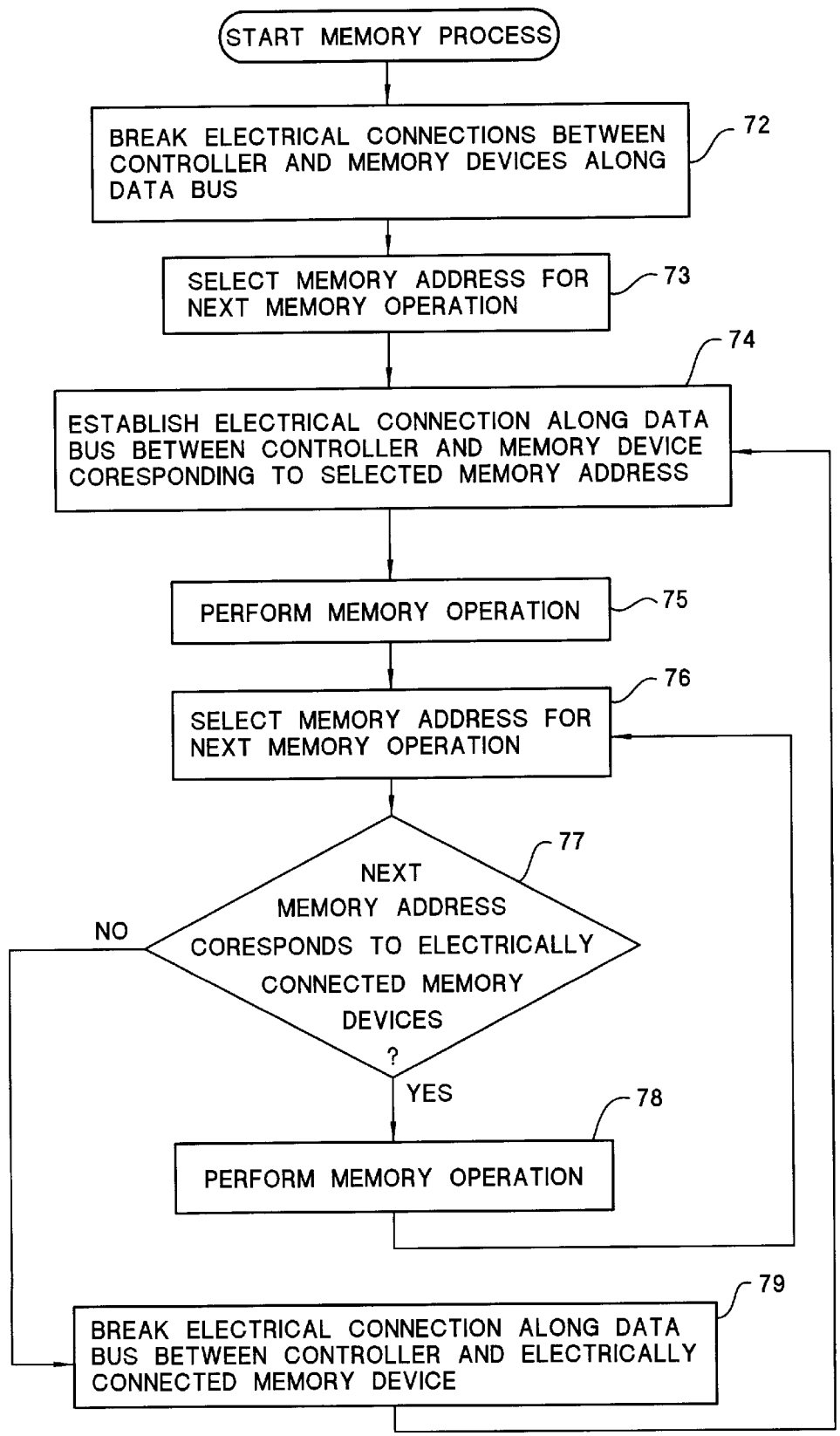
FIG. 6 is a block diagram of a method of minimizing capacitive loading of a data bus in a memory system according to the invention.

FIG. 6 is a block diagram depicting a method of minimizing capacitive loading of a data bus in a memory system. The method begins by breaking the electrical connections between the controller and all the memory devices along the data bus (block 72). This eliminates all the excess capacitive loading of the data bus. Next a memory address for the next memory operation is selected (block 73). An electrical connection is then established between the memory controller and the memory device corresponding to the selected memory address (block 74). After that, the memory operation is performed (block 75).

The memory address for the next memory operation is then selected (block 76). If this memory address corresponds to the same memory device that currently has an electrical connection established (block 77) then the next memory operation is performed (block 78) and the next memory address is selected (block 76). Otherwise, the electrical connection between the memory device and the memory controller is broken (79) and the process repeats by reestablishing a connection for the memory device corresponding to the new memory address (block 74).

The invention as discussed above and depicted in the drawings for purposes of illustration provides a low capacitance, high speed memory data bus with speed of propagation in excess of those systems available today. The overall speed at which data can propagate from the memory controller to memory devices, and vice versa is in excess of memory systems available today. The invention enable memory systems of the future to keep pace with CPU advances.

Having thus described an exemplary embodiment of the invention, it will be apparent that further alterations, modifications, and improvements will also occur to those skilled in the art. Such alterations, modifications, and improvements, though not expressly described or mentioned above, are nonetheless intended and implied to be within the scope of the invention. Accordingly, the foregoing discussion is intended to be illustrative only; the invention is limited and defined only by the various following claims and equivalents thereto.

I claim:

1. A digital memory system comprising:
   a controller;
   a first memory;
   a second memory;
   a first set of switches, each switch in the first set:
      including a first terminal, a second terminal, and a third terminal,
      switchable between a closed setting and an open setting, the closed setting electrically connecting the first terminal and the second terminal, the closed setting electrically disconnecting the first terminal and the second terminal, and
      switched between the closed setting and the open setting by a first control signal at the third terminal;
   a second set of switches, each switch in the second set:
      including a fourth terminal, a fifth terminal, and a sixth terminal,
      switchable between a closed setting and an open setting, the closed setting electrically connecting the fourth terminal and the fifth terminal, the closed setting electrically disconnecting the fourth terminal and the fifth terminal, and
      switched between the closed setting and the open setting by a second control signal at the sixth terminal;
   primary data lines electrically connecting the controller, the first terminal of each switch in the first set, and the third terminal of each switch in the second set;
   first memory data lines, each first memory data line electrically connecting the first memory and the second terminal of each switch in the first set;
   second memory data lines, each second memory data line electrically connecting the second memory and the fourth terminal of each switch in the second set;
   a first control line electrically connecting the controller and the third terminals; and
   a second control line electrically connecting the controller and the sixth terminals.

2. A digital memory system of claim 1, wherein the first and second set of switches include field effect transistors.

3. A digital memory system of claim 1, wherein each primary data line includes:
   a board trace portion electrically connected to the controller;
   a module trace portion electrically connected to one of the first terminal and the third terminal; and
   a module connector electrically connecting the board trace portion to the module trace portion.

4. A digital memory system of claim 1, wherein the switches are proximate to the module connectors.

5. A digital memory system of claim 1, wherein the first and second memory data lines include termination resistors.

6. A memory module for reducing the capacitance in a memory system data bus comprising:
   a substrate,
   a memory chip affixed to the substrate;
   data pins affixed to the substrate;
   switches affixed to the substrate, each switch including:
      a first terminal,
      a second terminal,
      a closed position, electrically connecting the first terminal and the second terminal, and
      an open position, electrically disconnecting the first terminal and the second terminal;
   primary data lines, each primary data line electrically connecting one data pin and the first terminal of one switch; and
   secondary data lines, each secondary data line electrically connecting the memory chip and the second terminal of one switch.

7. A memory module of claim 6, wherein the switches are proximate to the data pins.

8. A memory module of claim 6, wherein the switches include field effect transistors.

9. A memory module of claim 6, further comprising:
   a position controller associated with each switch for selecting one of the open position and the closed position;
   a command pin affixed to one of the major surfaces proximate to the connection edge; and
   a command line electrically connecting the command pin and the position controller of each switch.

10. A memory module of claim 6, wherein the secondary data lines include termination resistors.

11. A memory module of claim 6, wherein:
   the switches are proximate to the data pins;
   the switches include field effect transistors;
   the switches include a position controllers for selecting one of the open position and the closed position; and
   the position controllers are electrically connected to a common control line.

12. In a memory system of the kind that includes a plurality of memory devices that each communicate with an external circuit via individual external data buses electrically connected to each of the plurality of memory devices, a method of minimizing capacitive loading of the external circuit, the method comprising:
   (a) responsive to a request from the external circuit to access a memory location in one of the memory devices, establishing an electrical connection between the individual external data bus electrically connected to said memory device and the external circuit;

(b) providing the requested access; and (c) breaking the electrical connection between said individual external data bus and the external circuit after the access has been completed, thereby reducing capacitive loading of the external circuit.

13. A method according to claim 12, the method further comprising between steps (b) and (c) the step of repeating step (a) and (b) when the next request from the external circuit is to access a memory location in the said memory device.

14. A method according to claim 12, wherein the external circuit includes switches associated with each of the individual external data buses for selectively breaking the electrical connection between the external circuit and the individual external data buses in response to a first command signal and selectively establishing the electrical connection between the external circuit and the individual external data buses in response to a second command signal, wherein:

step (a) includes sending the second command signal to the switches associated with the data bus of said memory device; and step (c) includes sending the first command signal to the switches associated with the data bus of said memory device.

15. A method according to claim 13 additionally comprising:

(d) repeating steps (a) through (d).

* * * * *